United States Patent
Hsu et al.

(10) Patent No.: US 11,201,147 B2
(45) Date of Patent: Dec. 14, 2021

(54) COMPOSITE POWER ELEMENT AND METHOD FOR MANUFACTURING THE SAME

(71) Applicant: Cystech Electronics Corp., New Taipei (TW)

(72) Inventors: Hsin-Yu Hsu, New Taipei (TW); Chen-Huang Wang, New Taipei (TW); Shih-Chieh Hung, New Taipei (TW)

(73) Assignee: CYSTECH ELECTRONICS CORP., Newtaipei (TW)

( * ) Notice: Subject to any disclaimer, the term of this patent is extended or adjusted under 35 U.S.C. 154(b) by 0 days.

(21) Appl. No.: 17/007,061

(22) Filed: Aug. 31, 2020

(65) Prior Publication Data

US 2021/0358907 A1    Nov. 18, 2021

(30) Foreign Application Priority Data

May 14, 2020    (TW) .................................. 109115961

(51) Int. Cl.
| | |
|---|---|
| H01L 27/06 | (2006.01) |
| H01L 29/866 | (2006.01) |
| H01L 49/02 | (2006.01) |
| H01L 29/423 | (2006.01) |
| H01L 29/40 | (2006.01) |
| H01L 29/66 | (2006.01) |

(52) U.S. Cl.
CPC .......... *H01L 27/0629* (2013.01); *H01L 28/20* (2013.01); *H01L 29/401* (2013.01); *H01L 29/4236* (2013.01); *H01L 29/66106* (2013.01); *H01L 29/866* (2013.01)

(58) Field of Classification Search
None
See application file for complete search history.

(56) References Cited

U.S. PATENT DOCUMENTS

| | | | | |
|---|---|---|---|---|
| 2013/0020576 A1* | 1/2013 | Hsieh | ................. | H01L 29/7813 257/66 |
| 2013/0069064 A1* | 3/2013 | Yoshihira | ............ | H01L 29/7811 257/49 |

FOREIGN PATENT DOCUMENTS

TW     201037836 A1    10/2010

* cited by examiner

*Primary Examiner* — Khaja Ahmad
(74) *Attorney, Agent, or Firm* — Li & Cai Intellectual Property (USA) Office

(57) ABSTRACT

A composite power element and a method for manufacturing the same are provided. The power element includes a substrate structure, an insulation layer, a dielectric layer, a metal-oxide-semiconductor field-effect transistor (MOSFET), and a zener diode. The MOSFET is formed in a transistor formation region of the substrate structure. The zener diode is formed in a circuit element formation region of the substrate structure, and includes a zener diode doped structure formed on the insulation layer and covered by the dielectric layer. The zener diode doped structure includes a P-type doped region and an N-type doped region. The zener diode includes a zener diode metal structure formed on the dielectric layer and partially passes through the dielectric layer to be electrically connected to the P-type doped region and the N-type doped region. The zener diode is configured to receive a reverse bias voltage when the power element is energized.

10 Claims, 12 Drawing Sheets

COMPOSITE POWER ELEMENT AND METHOD FOR MANUFACTURING THE SAME

CROSS-REFERENCE TO RELATED PATENT APPLICATION

This application claims the benefit of priority to Taiwan Patent Application No. 109115961, filed on May 14, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power element, and more particularly to a composite power element and a method for manufacturing the same.

BACKGROUND OF THE DISCLOSURE

In conventional power elements, such as metal-oxide-semiconductor field-effect transistor (MOSFET) and bipolar junction transistor (BJT), if additional circuit elements (i.e., resistor or zener diode) are needed in a circuit design to form an electronic circuit with specific functions, these circuit elements need to be electrically connected to the power element by soldering. However, this type of connection method between the circuit elements and the power element will increase the complexity of product manufacturing and cannot effectively reduce a volume of an end product.

SUMMARY OF THE DISCLOSURE

In response to the above-referenced technical inadequacies, the present disclosure provides a composite power element and a method for manufacturing the same.

In one aspect, the present disclosure provides a composite power element including a substrate structure, an insulation layer, a dielectric layer, a metal-oxide-semiconductor field-effect transistor, and a zener diode. The substrate structure includes a base layer and an epitaxial layer formed on the base layer. The epitaxial layer concavely forms at least a trench, the substrate structure defines a transistor formation region and a circuit element formation region adjacent to the transistor formation region along a length direction of the substrate structure, and the trench is located in the transistor formation region. The insulation layer is formed on the epitaxial layer and an inner wall of the trench, extendingly. The portion of the insulation layer located on the inner wall of the trench is defined as a trench insulation layer which surroundingly forms a groove, and the portion of the insulation layer located on the epitaxial layer is defined as a cover insulation layer. The dielectric layer is formed on the insulation layer. The metal-oxide-semiconductor field-effect transistor is located in the transistor formation region. The metal-oxide-semiconductor field-effect transistor includes a gate filling structure, a matrix doping structure, a source metal structure, and a drain metal structure. The gate filling structure is formed in the groove of the trench insulation layer. The matrix doping structure is formed in the epitaxial layer and located in the surrounding area of the trench. The source metal structure is formed on the dielectric layer and partially passes through the dielectric layer to be electrically connected to the matrix doping structure. The drain metal structure is formed on a bottom surface of the base layer. The zener diode is located in the circuit element formation region. The zener diode includes a zener diode doping structure and a zener diode metal structure. The zener diode doping structure is formed on the cover insulation layer and is covered by the dielectric layer. The zener diode doping structure includes a P-type doped region and an N-type doped region which are in contact with each other. The zener diode metal structure is formed on the dielectric layer and partially passes through the dielectric layer to be electrically connected to the P-type doped region and the N-type doped region of the zener diode doping structure. The zener diode is configured to receive a reverse bias voltage when the composite power element is energized.

In another aspect, the present disclosure provides a method for manufacturing a composite power element, including: providing a substrate structure including a base layer and an epitaxial layer formed on the base layer; in which the epitaxial layer concavely forms at least a trench, the substrate structure defines a transistor formation region and a circuit element formation region adjacent to the transistor formation region along a length direction of the substrate structure, and the trench is located in the transistor formation region; forming an insulation layer on the epitaxial layer and an inner wall of the trench, extendingly; in which the portion of the insulation layer located on the inner wall of the trench is defined as a trench insulation layer which surroundingly forms a groove, and the portion of the insulation layer located on the epitaxial layer is defined as a cover insulation layer; forming a dielectric layer on the insulation layer; forming a metal-oxide-semiconductor field-effect transistor in the transistor formation region of the substrate structure; in which the metal-oxide-semiconductor field-effect transistor includes: a gate filling structure, a matrix doping structure, a source metal structure, and a drain metal structure; in which the gate filling structure is formed in the groove of the trench insulation layer, the matrix doping structure is formed in the epitaxial layer and located in a surrounding area of the trench, the source metal structure is formed on the dielectric layer and partially passes through the dielectric layer to be electrically connected to the matrix doping structure, and the drain metal structure is formed on a bottom surface of the base layer; and forming a zener diode in the circuit element formation region of the substrate structure; in which the zener diode includes: a zener diode doping structure and a zener diode metal structure; in which the zener diode doping structure is formed on the cover insulation layer and is covered by the dielectric layer, the zener diode doping structure includes a P-type doped region and an N-type doped region which are in contact with each other; in which the zener diode metal structure is formed on the dielectric layer and partially passes through the dielectric layer to be electrically connected to the P-type doped region and the N-type doped region of the zener diode doping structure; in which the zener diode is configured to receive a reverse bias voltage when the composite power element is energized.

Therefore, the composite power element and the method for manufacturing the same of the present disclosure can integrate formations of different electronic components (i.e., zener diode, resistor, and normal diode) into the manufacturing process of the metal-oxide-semiconductor field-effect transistor (especially the process after depositing polysilicon) so as to form a required power element, where additional processes are not necessary, thereby simplifying a complex process and reducing the volume of an end product.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1A:
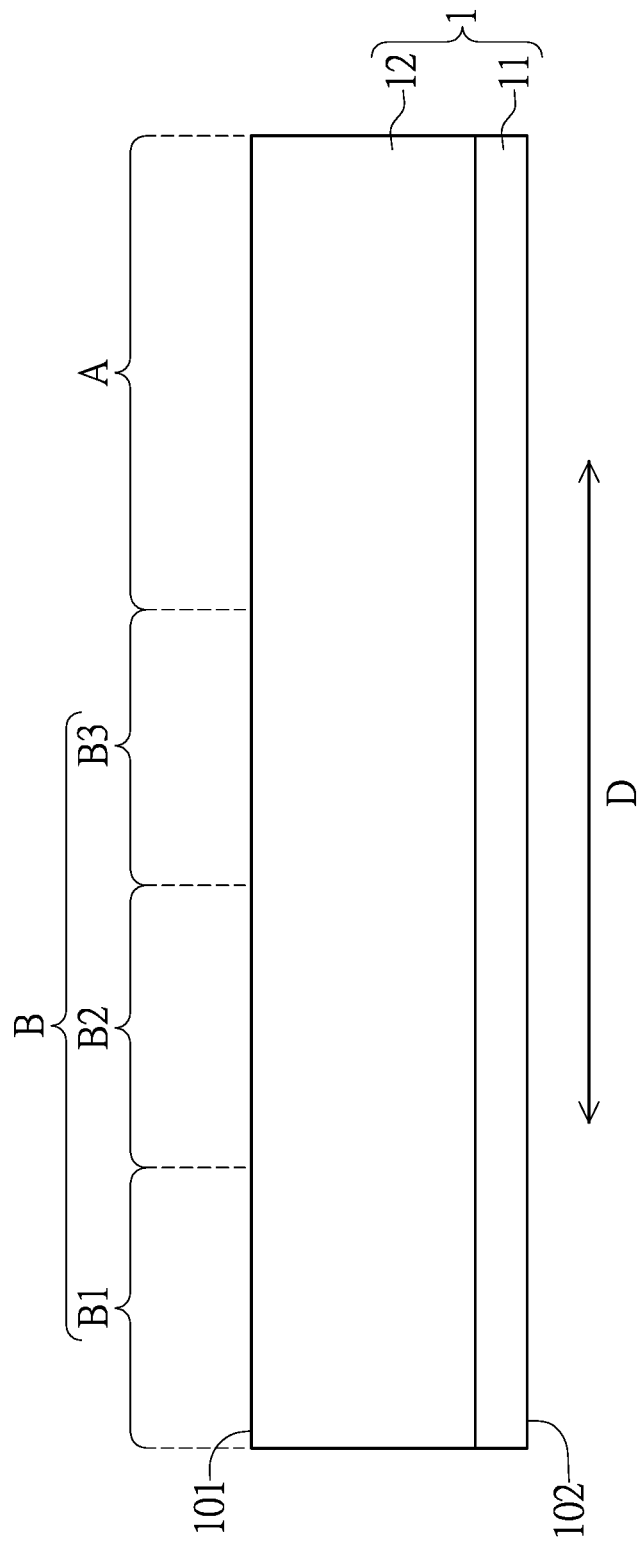
FIG. 1A to FIG. 1H are schematic views showing a method for manufacturing a composite power element according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1B:
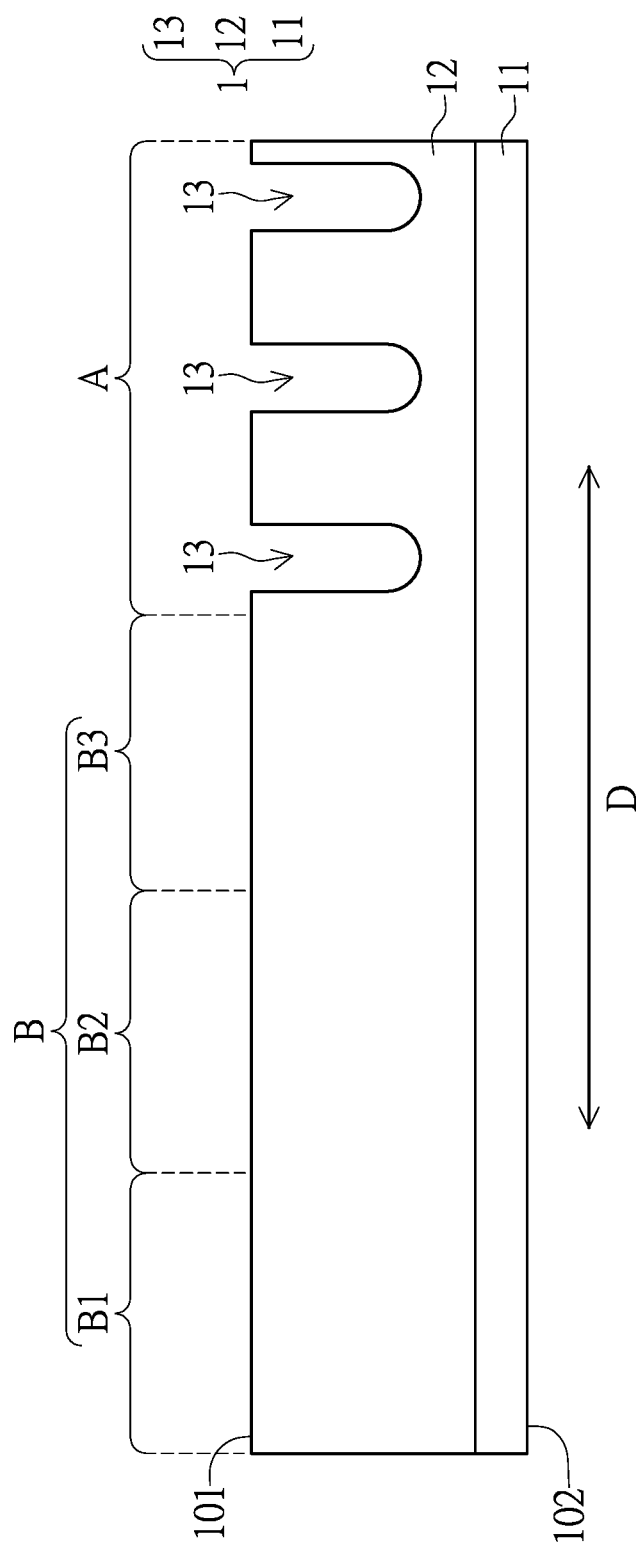
Figure 1C:
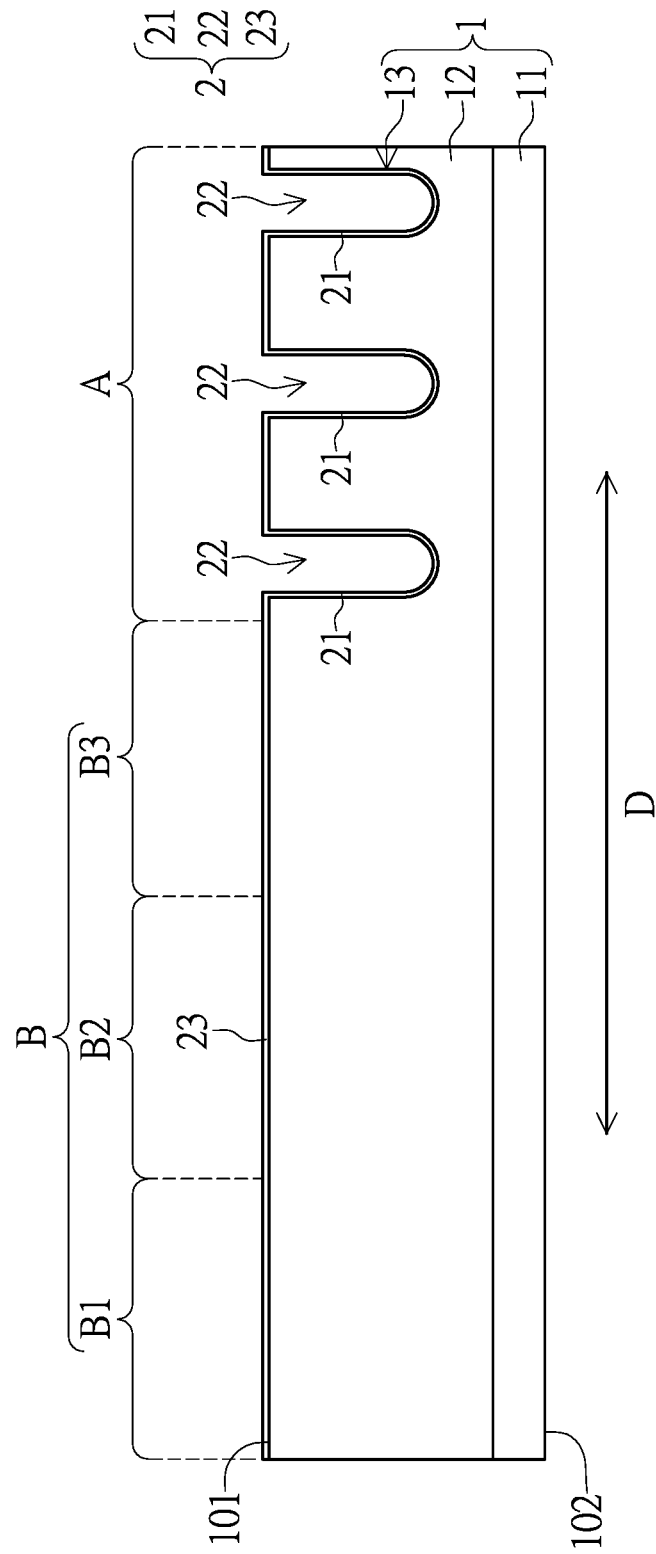
Figure 1D:
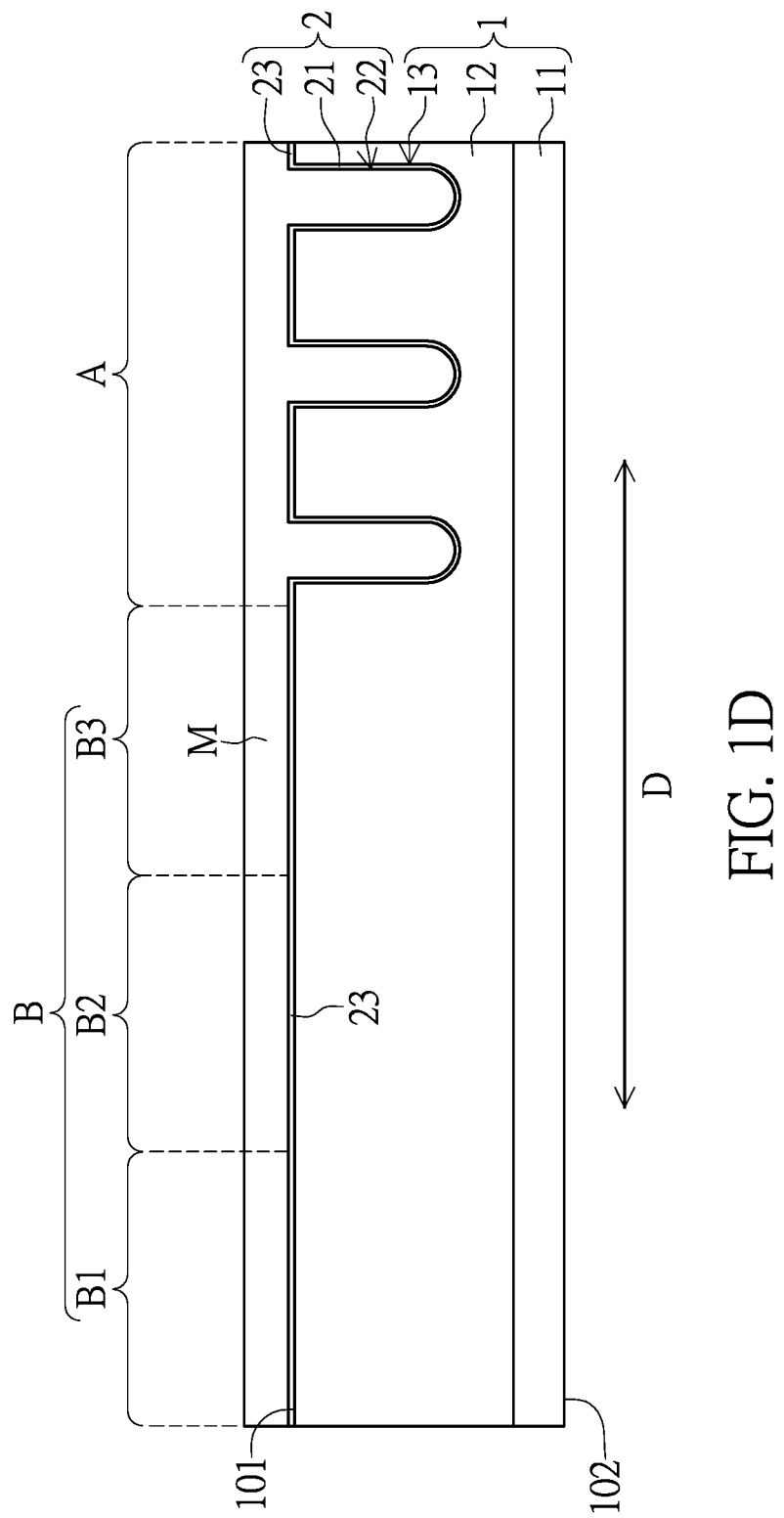
Figure 1E:
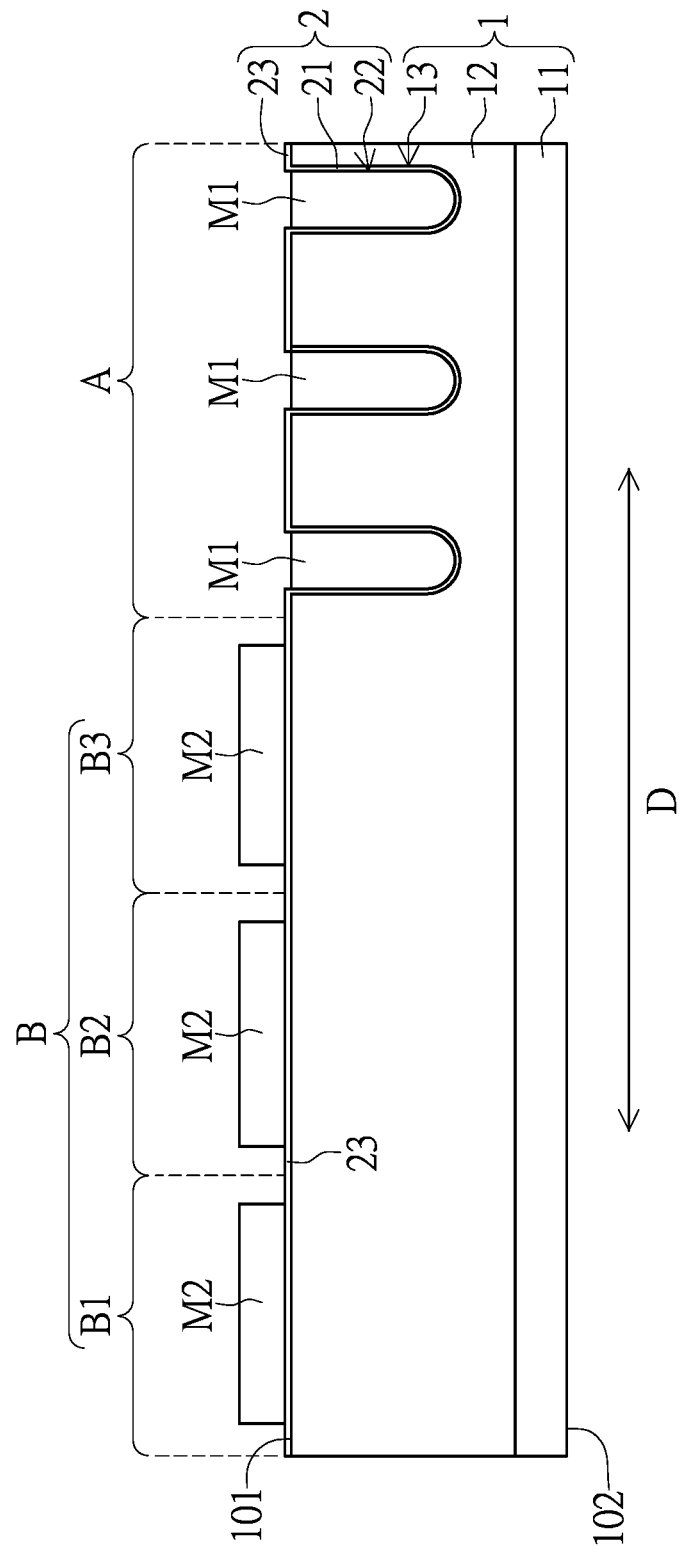
Figure 1F:
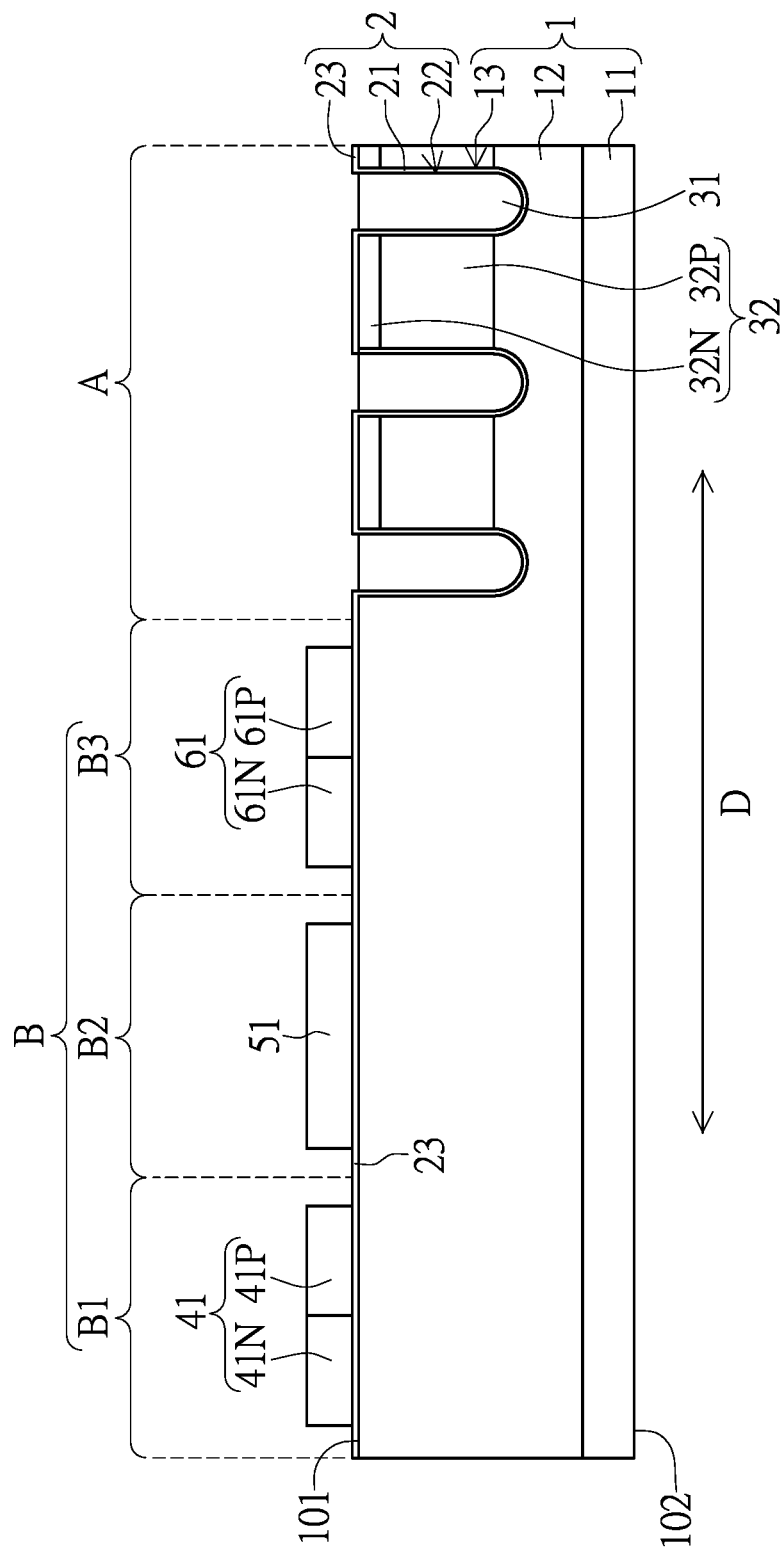
Figure 1G:
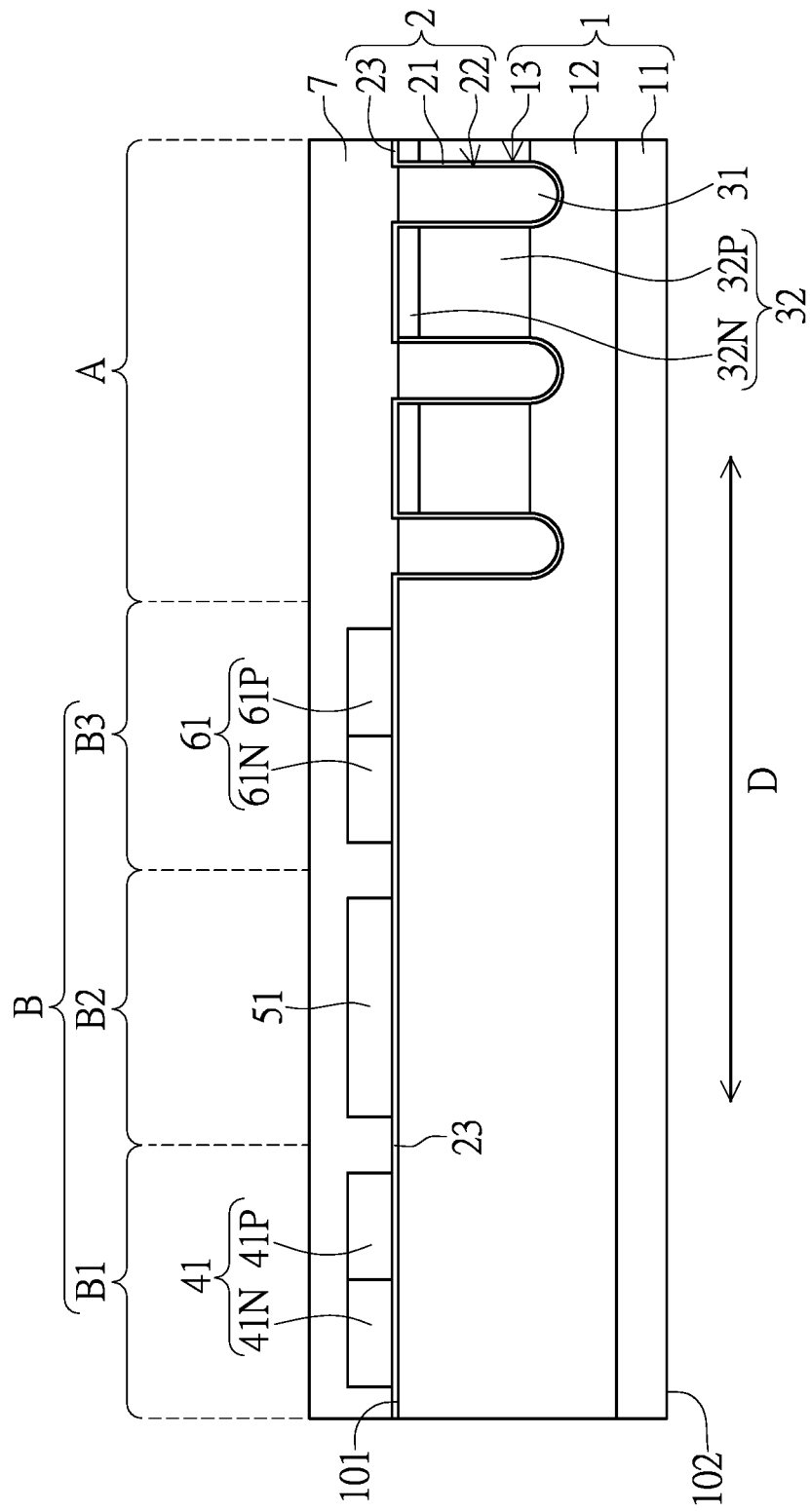
Figure 1H:
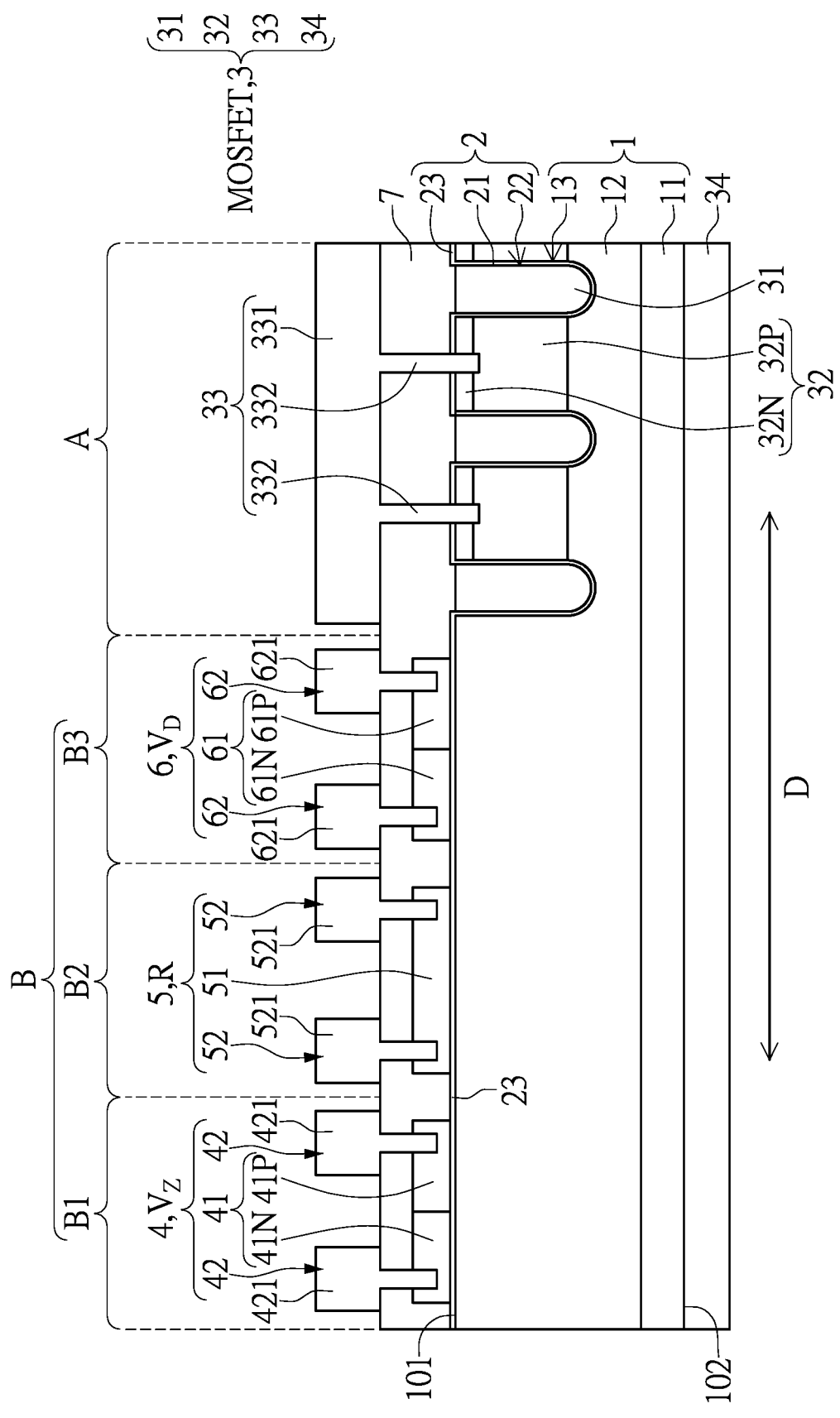
Figure 2:
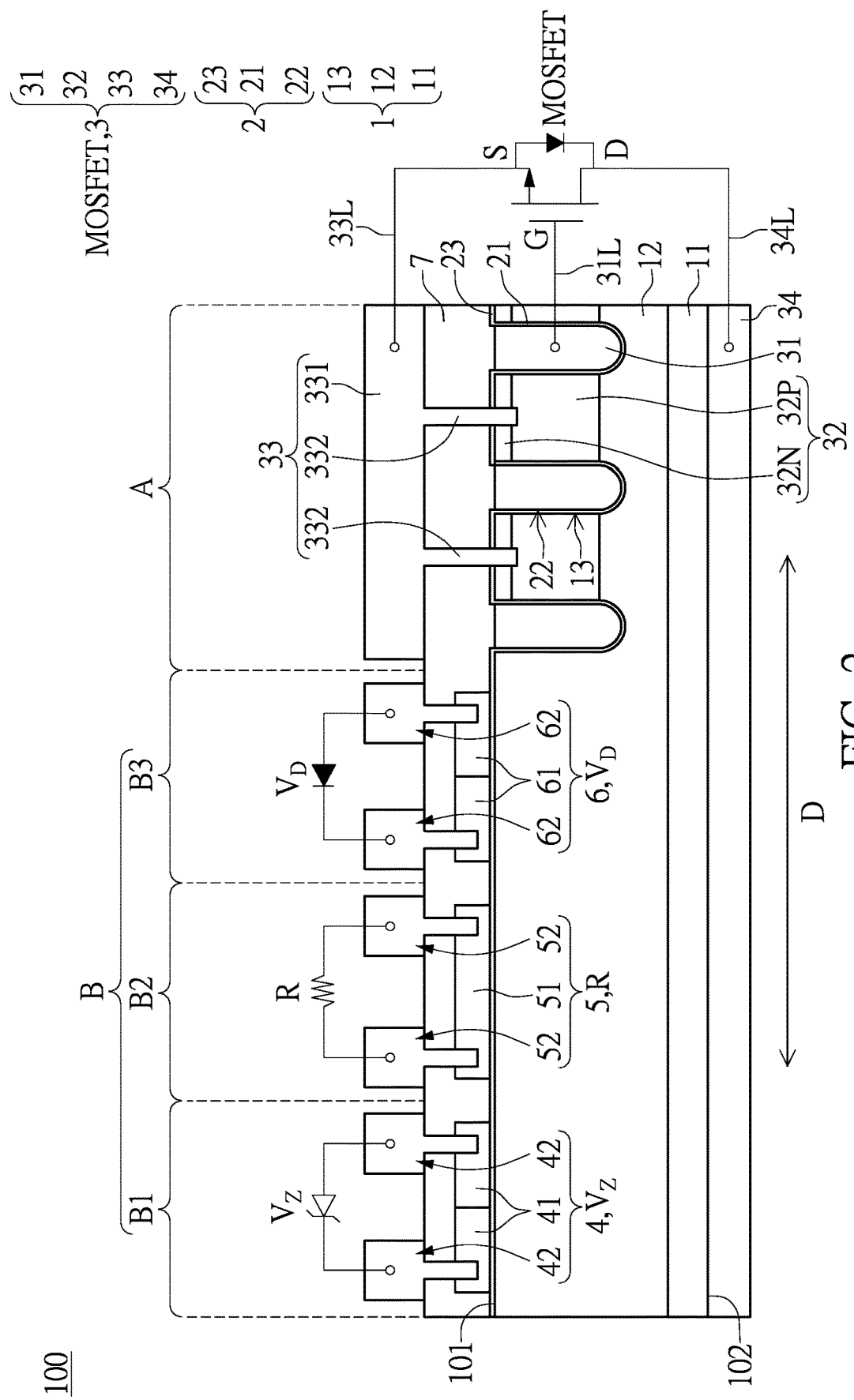
FIG. 2 is a cross-sectional view showing the composite power element according to the first embodiment of the present disclosure (indicating an equivalent circuit corresponding to the components in the power element).
Figure 3:
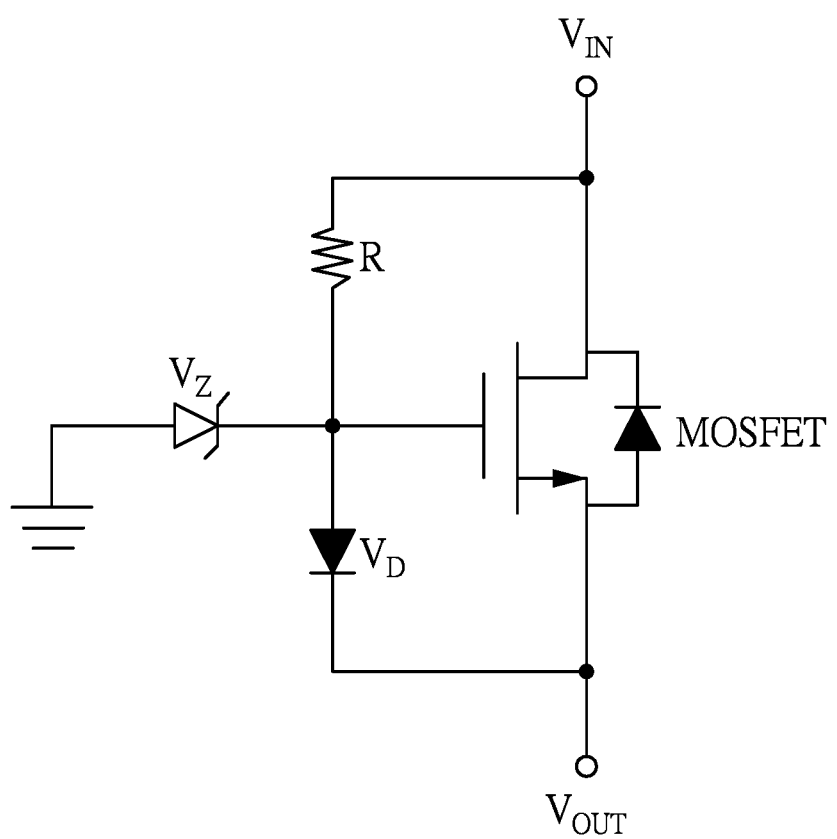
FIG. 3 is an equivalent circuit diagram of the composite power element according to the first embodiment of the present disclosure.

Referring to FIG. 1A to FIG. 1H, FIG. 2, and FIG. 3, a first embodiment of the present disclosure provides a method for manufacturing a composite power element 100. The method for manufacturing the composite power element includes steps S110 to S180. FIG. 1A to FIG. 1H are schematic views showing the method for manufacturing the composite power element according to the first embodiment of the present disclosure. FIG. 2 is a cross-sectional view showing the composite power element according to the first embodiment of the present disclosure (indicating an equivalent circuit corresponding to the components in the power element). FIG. 3 is an equivalent circuit diagram of the composite power element according to the first embodiment of the present disclosure.

It should be noted that the order of the steps and the actual operation in the present embodiment can be adjusted according to requirements and are not limited to those in the present embodiment.

The composite power element 100 of the present embodiment is a power element based on a metal-oxide-semiconductor field-effect transistor (MOSFET). That is, the composite power element 100 of the present embodiment is an improved power element of the metal-oxide-semiconductor field-effect transistor as a basic structure. Furthermore, the composite power element 100 of the present embodiment may be applied to a high voltage regulator, but the present disclosure is not limited thereto.

In the present embodiment, the method for manufacturing the composite power element is firstly described below. For ease of understanding, a unit region of the composite power element is taken as an example, and a cross-sectional view of the unit region is used for explanation. The diagram corresponding to each step can be referred to, as can the diagrams of other steps, if necessary. The specific steps of the method for manufacturing the composite power element are described below.

Referring to FIG. 1A, step S110 includes: providing a substrate structure 1. The substrate structure 1 includes a base layer 11 and an epitaxial layer 12 formed on the base layer 11, in which two opposite surfaces of the substrate structure 1 are respectively defined as a top surface 101 and a bottom surface 102. More specifically, a side surface of the epitaxial layer 12 away from the base layer 11 is defined as the top surface 101, and a side surface of the base layer 11 away from the epitaxial layer 12 is defined as the bottom surface 102.

Further, a material of the base layer 11 may be, for example, an $N^+$-type doped semiconductor or a $P^+$-type doped semiconductor. The epitaxial layer 12 may be formed on the base layer 11 through an epitaxial process, and a conductive type of the epitaxial layer 12 may be the same as a conductive type of the base layer 11 (i.e., $N^+$-type doping or $P^+$-type doping).

In the present embodiment, the base layer 11 is an $N^+$-type doped semiconductor (i.e., $N^+$ substrate), and the epitaxial layer 12 is an $N^-$-type doped semiconductor (i.e., $N^-$ EPI). In addition, a doping concentration of the base layer 11 is greater than that of the epitaxial layer 12. That is, the base layer 11 is a heavily doped region, and the epitaxial layer 12 is a lightly doped region, but the present disclosure is not limited thereto.

Further, the substrate structure 1 defines a transistor formation region A and a circuit element formation region B adjacent to the transistor formation region A along a length direction D of the substrate structure 1. The circuit element formation region B can be further divided into a zener diode formation region B1, a resistor formation region B2, and a normal diode formation region B3.

In the present embodiment, the resistor formation region B2 is located between the zener diode formation region B1 and the normal diode formation region B3. The zener diode formation region B1 is farther away from the transistor formation region A than the resistor formation region B2. The normal diode formation region B3 is closer to the transistor formation region A than the resistor formation region B2, but the present disclosure is not limited thereto.

Referring to FIG. 1B, step S120 includes: forming a plurality of trenches 13 that are respectively recessed in the epitaxial layer 12, in which the plurality of trenches 13 are all located in the above-mentioned transistor formation region A. The plurality of trenches 13 may be formed by etching. More specifically, the plurality of trenches 13 are recessed from the side surface of the epitaxial layer 12 away from the base layer 11 at intervals along the length direction D. Further, the bottoms of the plurality of trenches 13 are not in contact with the base layer 11 and are spaced apart from the base layer 11 by a distance. In other words, the plurality of trenches 13 are recessed from the top surface of the base structure 1 and are not in contact with the base layer 11 of the base structure 1.

In the present embodiment, a trench depth H of each of the trenches 13 is generally between 0.5 micrometers and 3 micrometers, and preferably between 1 micrometers and 2 micrometers, but the present disclosure is not limited thereto.

It should be noted that the plurality of trenches 13 are described with respect to the trenches 13 at different locations in the epitaxial layer 12 from a cross-sectional view angle. When viewing the power element as a whole, the trenches 13 may be in spatial communication with each other or be separated from each other, and the present disclosure is not limited thereto.

Referring to FIG. 1C, step S130 includes: extendingly forming an insulation layer 2 (also called oxide layer) on the side surface of the epitaxial layer 12 away from the base layer 11 (i.e., the top surface 101 of the substrate structure 1) and inner walls of the plurality of trenches 13. The insulation layer 2 may be formed by a low temperature oxide deposition (LTO deposition) process or a thermal oxidation process, but the present disclosure is not limited thereto.

In the present embodiment, the thickness of the insulation layer 2 is approximately between 5 nm and 100 nm, and the material of the insulation layer 2 may be, for example, silicon compound. For example, the silicon compound may be silicon dioxide, but the present disclosure is not limited thereto.

Furthermore, the portion of the insulation layer 2 located on the inner wall of each trench 13 is defined as a trench insulation layer 21 (or trench oxide layer), and each of the trench insulation layers 21 surroundingly forms a groove 22. That is, a plurality of trench insulation layers 21 are respectively formed on the inner walls of the plurality of trenches 13, and the plurality of trench insulation layers 21 respectively surround the plurality of grooves 22. In addition, the remaining portion of the insulation layer 2 (i.e., the portion of the insulation layer 2 located on the top surface 101 of the epitaxial layer 12) is defined as a cover insulation layer 23 (also called cover oxide layer).

The plurality of trench insulation layers 21 are all located in the above-mentioned transistor formation region A. The cover insulation layer 23 is extendingly located in the above-mentioned transistor formation region A and the circuit element formation region B.

Referring to FIG. 1D, step S140 includes: forming a polysilicon material M on the side surface of the insulation layer 2 away from the epitaxial layer 12 so that the poly-silicon material M covers the cover insulation layer 23 and is filled in the plurality of grooves 22 respectively surrounded by the plurality of trench insulation layers 21. The poly-silicon material M may be formed by silane ($SiH_4$) through a low pressure chemical vapor deposition (LPCVD) process, but the present disclosure is not limited thereto.

In the present embodiment, the poly-silicon material M is deposited to a certain thickness on the insulation layer 2 so that an outer surface of the poly-silicon material M (i.e., the side surface of the poly-silicon material M away from the base layer 11) is a flat surface. More specifically, portions of the outer surface of the poly-silicon material M above the plurality of grooves 22 and the cover insulation layer 23 are substantially flush with each other, but the present disclosure is not limited thereto.

Referring to FIG. 1E, step S150 includes: performing a lithography imaging process and an etching process on the poly-silicon material M to remove portions of the poly-silicon material M. Accordingly, a plurality of poly-silicon filling structures M1 are respectively formed in the plurality of grooves 22 surrounded by the plurality of trench insulation layers 21, and a plurality of poly-silicon block structures M2 are formed on the cover insulation layer 23.

In the present embodiment, since the plurality of poly-silicon filling structures M1 are respectively formed in the plurality of grooves 22 surrounded by the plurality of trench insulation layers 21, the plurality of poly-silicon filling structures M1 are the same as the plurality of trench insulation layers 21 and are all located in the above-mentioned transistor formation region A.

Further, after the plurality of poly-silicon filling structures M1 are etched, exposed surfaces of the plurality of poly-silicon filling structures M1 (i.e., top surfaces of the poly-silicon filling structures M1 in FIG. 1E) are lower than the outer surface of the cover insulation layer 23 (i.e., the side surface of the cover insulation layer 23 away from the epitaxial layer 12 in FIG. 1E), but the present disclosure is not limited thereto.

In addition, the plurality of poly-silicon block structures M2 are all formed on the side surface of the cover insulation layer 23 away from the epitaxial layer 12, and the plurality of poly-silicon block structures M2 are all located in the above-mentioned circuit element formation region B, so as to be fabricated into different circuit elements (e.g., zener diode, resistor, and normal diode . . . etc.) in a subsequent manufacturing process.

Further, the plurality of poly-silicon block structures M2 are arranged at intervals on the cover insulation layer 23. In the present embodiment, the number of the plurality of poly-silicon block structures M2 is three. The three poly-silicon block structures M2 are respectively located in the zener diode formation region B1, the resistor formation region B2, and the normal diode formation region B3 of the circuit element formation region B.

It is worth mentioning that, in the present embodiment, raw materials M of the poly-silicon filling structures M1 and the poly-silicon block structures M2 are formed in the same poly-silicon deposition process, but the present disclosure is not limited thereto. The raw materials M of the poly-silicon filling structures M1 and the poly-silicon block structures M2 can also be formed through multiple poly-silicon deposition processes (e.g., 2, 3, or more processes) according to process requirements.

Referring to FIG. 1F, step S160 includes: implementing an ion implantation process, so that the plurality of poly-silicon filling structures M1 located in the transistor formation region A are respectively formed as a plurality of gate filling structures 31 (also called doped poly-silicon filling structures), a portion of the epitaxial layer 12 located between any two adjacent trenches 13 is formed as a matrix doping structure 32, the poly-silicon block structure M2 located in the zener diode formation region B1 is formed as a zener diode doping structure 41, the poly-silicon block structure M2 located in the resistor formation region B2 is formed as a resistor doping structure 51, and the poly-silicon block structure M2 located in the normal diode formation region B3 is formed as a normal diode doping structure 61. It is worth mentioning that, in the present embodiment, in order to perform different doping procedures (e.g., P-type doping or N-type doping) on the poly-silicon materials M1, M2 and the epitaxial layer 12, the ion implantation process may include, for example, multiple ion implantation procedures which includes P-type doped ion implantation procedure and N-type doped ion implantation procedure.

Further, each of the gate filling structures 31 may be, for example, one of a P-type doped semiconductor and an N-type doped semiconductor, and the present disclosure is not limited thereto.

Each of the matrix doping structures 32 includes a P-type doped region 32P and an N-type doped region 32N formed on the P-type doped region 32P. That is, in each of the matrix doping structures 32, the N-type doped region 32N and the P-type doped region 32P are stacked on top of each other. The P-type doped region 32P is located on a lower side and is in contact with the epitaxial layer 12. The N-type doped region 32N is located on an upper side and is in contact with the cover insulation layer 23. It is worth mentioning that the conductive type of the P-type doped region 32P is different from the conductive type of the base layer 11 ($N^+$ type doped semiconductor), and is also different from the conductive type of the epitaxial layer 12 ($N^-$ type doped semiconductor). That is, the plurality of P-type doped regions 32P in the present embodiment are P-type doped semiconductors. The implanted ion type may be, for example, boron ions (B+), but the present disclosure is not limited thereto.

The zener diode doping structure 41 includes a P-type doped region 41P and an N-type doped region 41N located at one side of the P-type doped region 41P (i.e., a left side of the P-type doped region 41P as shown in FIG. 1F). That is, in the zener diode doping structure 41, the N-type doped region 41N and the P-type doped region 41P are respectively arranged on left and right sides and are in contact with each other. Furthermore, both the N-type doped region 41N and the P-type doped region 41P are formed on the cover insulation layer 23 and are in contact with the cover insulation layer 23.

The resistor doping structure 51 may be, for example, one of a P-type doped semiconductor and an N-type doped semiconductor. In the present embodiment, the resistor doping structure 51 is preferably a P-type doped semiconductor, but the present disclosure is not limited thereto. Furthermore, a doping concentration of the resistor doping structure 51 is lower than a doping concentration of the zener diode doping structure 41 or a doping concentration of the normal diode doping structure 61, so as to produce an effect of resistance.

The normal diode doping structure 61 is similar to the zener diode doping structure 41, and includes a P-type doped region 61P and an N-type doped region 61N located at one side of the P-type doped region 61P (i.e., a left side of the P-type doped region 61P as shown in FIG. 1F). That is, in the normal diode doping structure 61, the N-type doped region 61N and the P-type doped region 61P are respectively arranged on left and right sides and are in contact with each other. Furthermore, both the N-type doped region 61N and the P-type doped region 61P are formed on the cover insulation layer 23 and are in contact with the cover insulation layer 23.

It should be noted that the ions used in the ion implantation process described herein may be, for example, boron ions ($B^+$), zinc ions ($Zn^{2+}$), fluoride ions ($F^-$), nitrogen ions ($N^-$), oxygen ion ($O^{2-}$), carbon ion ($C^{4+}$), argon ion ($Ar^+$), phosphorus ion ($P^+$), arsenic ion ($As^+$), or antimony ion ($Sb^{2+}$).

Referring to FIG. 1G, step S170 includes: forming a dielectric layer 7 (interlayer dielectric, ILD) on the substrate structure 1 so that the insulation layer 2, the plurality of gate filling structures 31, the matrix doping structures 32, the zener diode doping structure 41, the resistor doping structure 51, and the normal diode doping structure 61 are covered by the dielectric layer 7.

The dielectric layer 7 may be formed by a chemical vapor deposition process, but the present disclosure is not limited thereto. For example, the dielectric layer 7 may also be formed by a physical vapor deposition process or other suitable deposition processes. Furthermore, the material of the dielectric layer 7 may be, for example, a silicon compound or other dielectric materials.

Further, an outer surface of the dielectric layer 7 may be planarized by a chemical mechanical polishing (CMP) process, but the present disclosure is not limited thereto.

Referring to FIG. 1H, step S180 includes: performing a metallization process to respectively form a source metal structure 33, a zener diode metal structure 42, a resistor metal structure 52, and a normal diode metal structure 62 on the dielectric layer 7, and to form a drain metal structure 34 on the bottom surface 102 of the substrate structure 1. It should be noted that the "metal structure" mentioned herein may be formed by deposition, and the "metal structure" may be an integrated structure formed of an aluminum/silicon/copper alloy, but the actual application of the present disclosure is not limited thereto.

The source metal structure 33 is located in the transistor formation region A. The source metal structure 33 is formed on the side surface of the dielectric layer 7 away from the base layer 11 and partially passes through the dielectric layer 7 to be electrically connected to at least one of the plurality of matrix doping structures 32.

In the present embodiment, the source metal structure 33 includes a source metal conductive portion 331 and two source metal contact plugs 332 connected to the source metal conductive portion 331. The source metal conductive portion 331 is formed on the side surface of the dielectric layer 7 away from the base layer 11. The two source metal contact plugs 332 are spaced apart from each other and respectively pass through the dielectric layer 7, so that the source metal conductive portion 331 can be electrically connected to two adjacent matrix doping structures 32 among the plurality of matrix doping structures 32 through the two source metal contact plugs 332.

In addition, a width of each of the source metal contact plugs 332 is smaller than a width of the corresponding matrix doping structure 32 connected thereto. Each of the source metal contact plugs 332 passes through the N-type doped region 32N of the corresponding matrix doping structure 32 and partially extends into the P-type doped region 32P. In this way, the two source metal contact plugs 332 are equipotential compared to the two matrix doping structures 32 they are electrically connected to.

The drain metal structure 34 is formed on the bottom surface 102 of the substrate structure 1. That is, the drain metal structure 34 is formed on the side surface of the base layer 11 away from the epitaxial layer 12. In the present embodiment, the drain metal structure 34 fully covers the bottom surface 102 of the substrate structure 1, but the present disclosure is not limited thereto.

According to the above configuration, as shown in FIG. 2, the source metal structure 33 can be used to electrically connect a source wire 33L to define a source S of the metal-oxide-semiconductor field-effect transistor (MOS-FET). The drain metal structure 34 can be used to electrically connect a drain wire 34L to define a drain D of the metal-oxide-semiconductor field-effect transistor. In addition, one of the plurality of gate filling structures 31 (i.e., the rightmost gate filling structure in FIG. 2) can be used to electrically connect a gate wire 31L to define a gate G of the metal-oxide-semiconductor field-effect transistor. The above-mentioned various components (i.e., the source metal structure 33, the drain metal structure 34, the gate filling structure 31, etc.) located in the transistor formation region A can jointly form a metal-oxide-semiconductor field-effect transistor 3, and the equivalent circuit diagram is shown in FIG. 3.

Referring to FIG. 1H again, the zener diode metal structure 42, the resistor metal structure 52, and the normal diode metal structure 62 are all located in the circuit element formation region B.

The zener diode metal structure 42 is located in the zener diode formation region B1. The zener diode metal structure 42 is formed on the side surface of the dielectric layer 7 away from the base layer 11 and partially passes through the dielectric layer 7 to be electrically connected to the zener diode doping structure 41. The zener diode metal structure 42 and the zener diode doping structure 41 can be matched with each other to form a zener diode 4, $V_Z$. The zener diode 4 is configured to receive a reverse bias voltage, and the zener diode 4 can withstand a voltage between 5 volts and 6 volts.

In the present embodiment, the zener diode metal structure 42 includes two metal pins 421. The two metal pins 421 of the zener diode metal structure 42 are spaced apart from each other, and both partially pass through the dielectric layer 7 to be respectively and electrically connected to the N-type doped region 41N and the P-type doped region 41P of the zener diode doping structure 41, so that the zener diode 4 is formed. In the zener diode 4, a potential of the metal pin 421 connected to the P-type doped region 41P is "lower" than a potential of the metal pin 421 connected to the N-type doped region 41N, thereby generating a "reverse bias voltage" when the composite power element 100 is energized.

The resistor metal structure 52 is located in the resistor formation region B2. The resistor metal structure 52 is formed on the side surface of the dielectric layer 7 away from the base layer 11 and partially passes through the dielectric layer 7 to be electrically connected to the resistor doping structure 51. The resistor metal structure 52 and the resistor doping structure 51 can be matched with each other to form a resistor 5, R.

In the present embodiment, the resistor metal structure 52 includes two metal pins 521. The two metal pins 521 of the resistor metal structure 52 are spaced apart from each other, and both partially pass through the dielectric layer 7 to be electrically connected to the resistor doping structure 51 (i.e., P-type doped semiconductor). The doping concentration of the resistor doping structure 51 is lower than that of the zener diode doping structure 41 and also lower than that of the normal diode doping structure 61, thereby generating a resistance when the composite power element 100 is energized.

The normal diode metal structure 62 is located in the normal diode formation region B3. The normal diode metal structure 62 is formed on the side surface of the dielectric layer 7 away from the base layer 11 and partially passes through the dielectric layer 7 to be electrically connected to the normal diode doping structure 61. The normal diode metal structure 62 and the normal diode doping structure 61 can be matched with each other to form a normal diode 6, $V_D$. The normal diode 6 is configured to receive a forward bias voltage, and the normal diode 6 can withstand a voltage between 0 volts and 0.7 volts.

In the present embodiment, the normal diode metal structure 62 includes two metal pins 621. The two metal pins 621 of the normal diode metal structure 62 are spaced apart from each other, and both partially pass through the dielectric layer 7 to be respectively and electrically connected to the N-type doped region 61N and the P-type doped region 61P of the normal diode doping structure 61, so that the normal diode 6 is formed. In the normal diode 6, a potential of the metal pin 621 connected to the P-type doped region 61P is "higher" than a potential of the metal pin 621 connected to the N-type doped region 61N, thereby generating a "forward bias voltage" when the composite power element 100 is energized.

It is worth mentioning that in the normal diode 6 of the present embodiment, the metal pin 621 connected to the P-type doped region 61P can be electrically connected to one of the plurality of gate filling structures 31 (i.e., the rightmost gate filling structure in FIG. 2) through a wire (not shown). Furthermore, the metal pin 621 connected to the N-type doped region 61N can be electrically connected to the source metal structure 33 of the metal-oxide-semiconductor field-effect transistor 3 through a wire (not shown), but the present disclosure is not limited thereto.

It is also worth mentioning that, in the present embodiment, the N-type doped region 32N of the matrix doping structure 32, the N-type doped region 41N of the zener diode 4, and the N-type doped region 61N of the normal diode 6 are completed in the same ion implantation procedure, but the present disclosure is not limited thereto.

After implementing the above steps S110 to S180, the composite power element 100 (also referred to as a trench-type power element) shown in FIG. 1H and FIG. 2 can be completed. The equivalent circuit diagram of the composite power element 100 of the present embodiment is shown in FIG. 3. It should be noted that, in practical application, each step may be substituted with a reasonable variation.

Furthermore, it should be noted that the above steps are described from the perspective of a cross-sectional view. Under the premise that conditions in the above steps are met, the possibility of implementing the present disclosure with various design layouts is not excluded. In other words, if viewed from a top view, the composite power element 100 of the present disclosure may have different design layouts.

According to the above configuration, the method for manufacturing the composite power element according to the embodiment of the present disclosure can integrate formations of different electronic components (i.e., zener diode, resistor, and normal diode) into the manufacturing process of the metal-oxide-semiconductor field-effect transistor (especially the process after depositing poly-silicon) so as to form a required power element, where additional processes are not necessary, thereby simplifying a complex process.

The method for manufacturing the composite power element according to the embodiment of the present disclosure has been described above. The specific structure of the composite power element of the present embodiment will be described below. It should be noted that although the composite power element of the present embodiment is manufactured by the above-mentioned manufacturing method, the present disclosure is not limited thereto. That is, the composite power element of the present disclosure may be produced by other methods for manufacturing the power element.

Referring to FIG. 1H, which is to be read in conjunction with FIG. 2 and FIG. 3, an embodiment of the present disclosure also discloses a composite power element 100, which includes a substrate structure 1, an insulation layer 2, a dielectric layer 7, a metal-oxide-semiconductor field-effect transistor 3 (MOSFET), a zener diode 4 ($V_Z$), a resistor 5 (R), and a normal diode 6 ($V_D$).

The substrate structure 1 includes a base layer 11 and an epitaxial layer 12 formed on the base layer 11. The epitaxial layer 12 concavely forms at least a trench 13. The substrate structure 1 defines a transistor formation region A and a circuit element formation region B adjacent to the transistor formation region A along a length direction D of the substrate structure 1. The trench 13 is located in the transistor formation region A.

The insulation layer 2 is extendingly formed on the epitaxial layer 12 and the inner wall of the trench 13. The portion of the insulation layer 2 located on the inner wall of the trench 13 is defined as a trench insulation layer 21, and the trench insulation layer 21 surroundingly forms a groove 22. The remaining portion of the insulation layer 2 is defined as a cover insulation layer 23. Furthermore, the dielectric layer 7 is formed on the insulation layer 2.

The metal-oxide-semiconductor field-effect transistor 3 is located in the transistor formation region A. The metal-oxide-semiconductor field-effect transistor 3 includes a gate filling structure 31, a matrix doping structure 32, a source metal structure 33, and a drain metal structure 34. The gate filling structure 31 is filled in the groove 22 of the trench insulation layer 21. The matrix doping structure 32 is formed in the epitaxial layer 12 and located in the surrounding area of the trench 13. The source metal structure 33 is formed on the dielectric layer 7 and partially passes through the dielectric layer 7 to be electrically connected to the matrix doping structure 32. The drain metal structure 34 is formed on a bottom surface of the base layer 11.

The zener diode 4 is located in the circuit element formation region B. The zener diode 4 includes a zener diode doping structure 41 and a zener diode metal structure 42. The zener diode doping structure 41 is formed on the cover insulation layer 23 and is covered by the dielectric layer 7. The zener diode doping structure 41 includes a P-type doped region 41P and an N-type doped region 41N which are in contact with each other. The zener diode metal structure 42 is formed on the dielectric layer 7 and partially passes through the dielectric layer 7 to be electrically connected to the P-type doped region 41P and the N-type doped region 41N of the zener diode doping structure 41. The zener diode 4 is configured to receive a reverse bias voltage when the composite power element 100 is energized.

The resistor 5 is located in the circuit element formation region B and is spaced apart from the zener diode 4. The resistor 5 includes a resistor doping structure 51 and a resistor metal structure 52. The resistor doping structure 51 is formed on the cover insulation layer 23 and is covered by the dielectric layer 7. The resistor doping structure 51 is a P-type doped semiconductor or an N-type doped semiconductor. The resistor metal structure 52 is formed on the dielectric layer 7 and partially passes through the dielectric layer 7 to be electrically connected to the resistor doping structure 51. The resistor 5 is configured to generate a resistance when the composite power element 100 is energized.

The normal diode 6 is located in the circuit element formation region B and is spaced apart from the zener diode 4. The normal diode 6 includes a normal diode doping structure 61 and a normal diode metal structure 62. The normal diode doping structure 61 is formed on the cover insulation layer 23 and is covered by the dielectric layer 7. The normal diode doping structure 61 includes a P-type doped region 61P and an N-type doped region 61N which are in contact with each other. The normal diode metal structure 62 is formed on the dielectric layer 7 and partially passes through the dielectric layer 7 to be electrically connected to the P-type doped region 61P and the N-type doped region 61N of the normal diode doping structure 61. The normal diode 6 is configured to receive a forward bias voltage when the composite power element 100 is energized. The normal diode 6 is disposed adjacent to the above-mentioned metal-oxide-semiconductor field-effect transistor 3, MOSFET.

Second Embodiment

Figure 4:
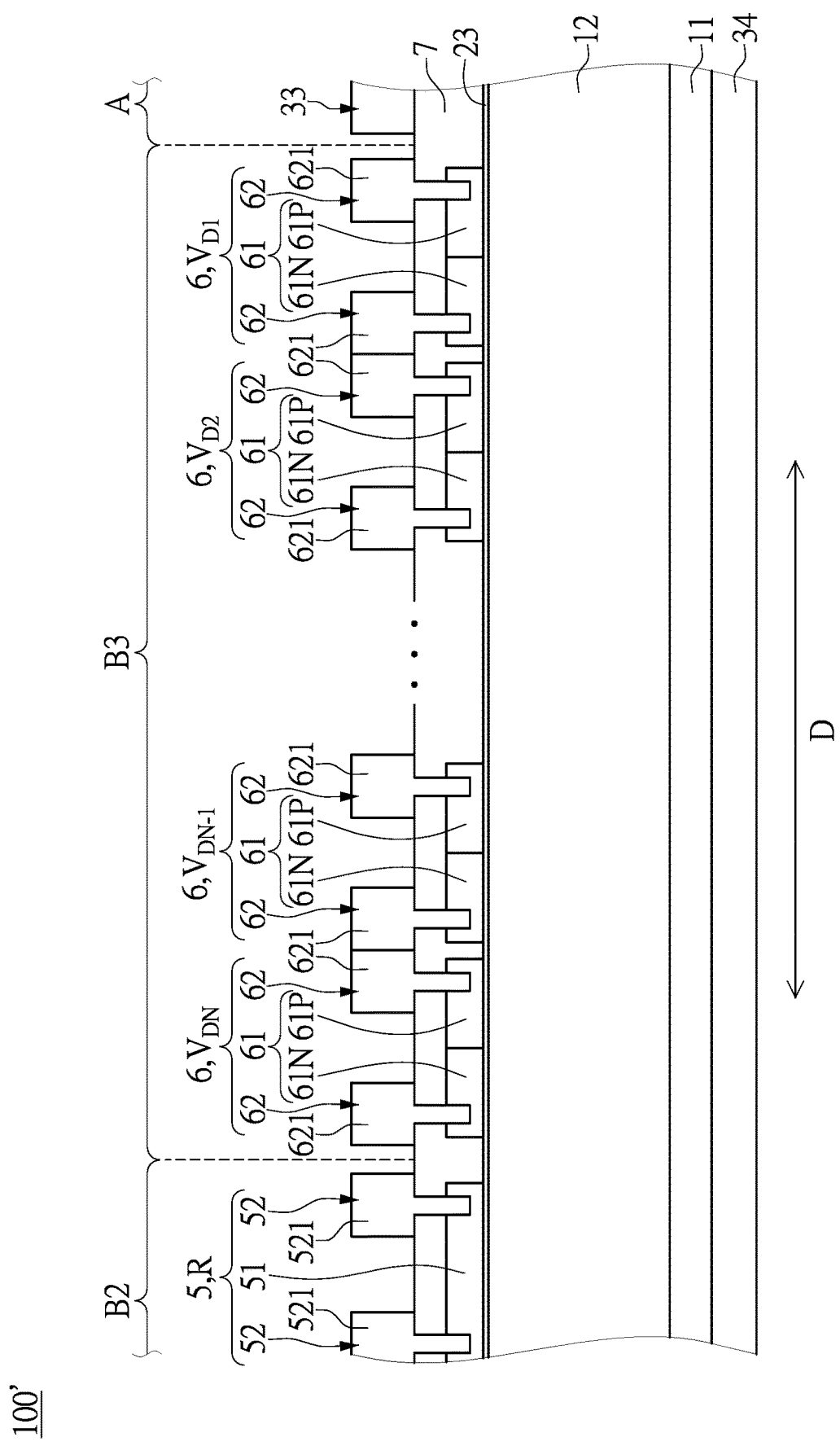
FIG. 4 is a partially enlarged view of a composite power element according to a second embodiment of the present embodiment.
Figure 5:
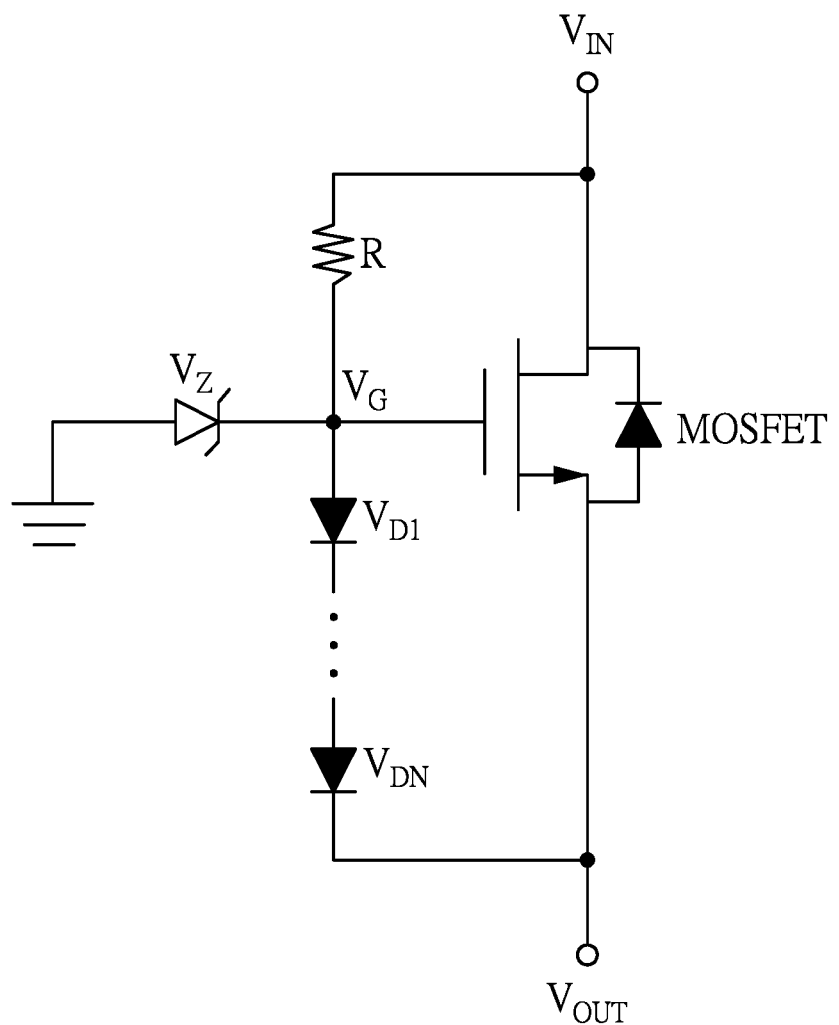
FIG. 5 is an equivalent circuit diagram of the composite power element according to the second embodiment of the present disclosure.

Referring to FIG. 4 and FIG. 5, a second embodiment of the present disclosure provides a composite power element 100'. FIG. 4 is a partially enlarged view of a composite power element according to a second embodiment of the present embodiment, and FIG. 5 is an equivalent circuit diagram of the composite power element according to the second embodiment of the present disclosure.

The structural design of the composite power element 100' according to the second embodiment of the present disclosure is substantially the same as the above-mentioned first embodiment. The difference is that the composite power element 100' of the present embodiment has a plurality of normal diodes 6 ($V_{D1}$ to $V_{DN}$) connected in series with each other.

As shown in FIG. 4, in the present embodiment, the number of the normal diodes 6 is plural. The plurality of normal diodes 6 ($V_{D1}$ to $V_{DN}$) are connected in series with each other and are all disposed on the cover insulation layer 23. In addition, the plurality of normal diodes 6 are all located in the normal diode formation region B3 of the circuit element formation region B. The number of the plurality of normal diodes 6 may be, for example, two or more.

More specifically, the plurality of normal diodes 6 connected in series with each other are arranged in a staggered manner of "N-type doped region/P-type doped region/N-type doped region/P-type doped region, and so on". Further, in any two of the normal diodes 6 that are adjacent and connected in series with each other, the metal pin 621 of one of the normal diodes 6 connected to the P-type doped region 61P is directly in contact with and electrically connected to the metal pin 621 of the other one of the normal diodes 6 connected to the N-type doped region 61N. In addition, the normal diode doping structure 61 of one of the normal diodes 6 does not directly contact the normal diode doping structure 61 of the other one of the normal diodes 6.

Further, as shown in FIG. 4, in the plurality of normal diodes 6 connected in series with each other, the metal pin 621 of a first normal diode $V_{D1}$ (i.e., the rightmost normal diode $V_{D1}$ as shown in FIG. 4) connected to the P-type doped region 61P can be electrically connected to one of the gate filling structures 31 of the metal-oxide-semiconductor field-effect transistor 3 (i.e., the rightmost gate filling structure as shown in FIG. 2) through a wire (not shown). In addition, the metal pin 621 of the Nth normal diode $V_{DN}$ (i.e., the leftmost normal diode $V_{DN}$ as shown in FIG. 4) connected to the N-type doped region 61N can be electrically connected to the source metal structure 33 of the metal-oxide-semiconductor field-effect transistor 3 through a wire (not shown), but the present disclosure is not limited thereto.

As shown in FIG. 5, since the composite power element 100' of the present embodiment has a plurality of normal diodes 6 ($V_{D1}$ to $V_{DN}$) connected in series with each other, $V_{GS}$ can be changed by adjusting the number of the normal diodes 6 to control a driving voltage of the composite power element 100' to achieve feasibility of driving various Power MOSFETs.

Accordingly, the concept of the above structural design can arbitrarily integrate Power MOSFETs of various voltages/currents according to the application requirements of the end products. The output voltage may be $V_{OUT}=V_G-V_D=V_Z-(V_{D1}+V_{D2}+\ldots V_{DN})$.

Beneficial Effect

In conclusion, the method for manufacturing the composite power element according to the embodiment of the present disclosure can integrate the formations of different electronic components (i.e., zener diode, resistor, and normal diode) into the manufacturing process of the metal-oxide-semiconductor field-effect transistor (especially the process after depositing poly-silicon) so as to form the required power element, where additional processes are not necessary, thereby simplifying the complex process and reducing the volume of the end product.

Further, since the composite power element of the present embodiment has the plurality of normal diodes ($V_{D1}$ to $V_{DN}$) connected in series with each other, the $V_{GS}$ can be changed by adjusting the number of the normal diodes to control the driving voltage of the composite power element to achieve the feasibility of driving various Power MOSFETs.

In addition, the structural design of the composite power element of the present embodiment can reduce the number of electronic components required to be placed on a system circuit board. Since part of the electronic components are integrated into an integrated component manufacturing process. Therefore, the volume of the end product can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A composite power element, comprising:
   a substrate structure including a base layer and an epitaxial layer formed on the base layer; wherein at least one trench is concavely formed on the epitaxial layer, the substrate structure defines a transistor formation region and a circuit element formation region adjacent to the transistor formation region along a length direction of the substrate structure, and the trench is located in the transistor formation region;
   an insulation layer being extendingly formed on the epitaxial layer and an inner wall of the trench; wherein a portion of the insulation layer located on the inner wall of the trench is defined as a trench insulation layer which surroundingly forms a groove, and a portion of the insulation layer located on the epitaxial layer is defined as a cover insulation layer;
   a dielectric layer being formed on the insulation layer;
   a metal-oxide-semiconductor field-effect transistor being located in the transistor formation region and including:
      a gate filling structure being formed in the groove of the trench insulation layer;
      a matrix doping structure being formed in the epitaxial layer and located in a surrounding area of the trench;
      a source metal structure being formed on the dielectric layer and partially passing through the dielectric layer to be electrically connected to the matrix doping structure; and
      a drain metal structure being formed on a bottom surface of the base layer; and
   a zener diode being located in the circuit element formation region and including:
      a zener diode doping structure being formed on the cover insulation layer and is covered by the dielectric layer; wherein the zener diode doping structure includes a P-type doped region and an N-type doped region which are in contact with each other; and
      a zener diode metal structure being formed on the dielectric layer and partially passing through the dielectric layer to be electrically connected to the P-type doped region and the N-type doped region of the zener diode doping structure; wherein the zener diode is configured to receive a reverse bias voltage when the composite power element is energized.

2. The composite power element according to claim 1, wherein in the zener diode, the zener diode metal structure includes two metal pins, the two metal pins are spaced apart from each other, and both the two metal pins partially pass through the dielectric layer to be respectively and electrically connected to the N-type doped region and the P-type doped region of the zener diode doping structure; wherein when the composite power element is energized, a potential of the metal pin connected to the P-type doped region is lower than a potential of the metal pin connected to the N-type doped region, so that the reverse bias voltage is generated.

3. The composite power element according to claim 1, further comprising:
   a resistor being located in the circuit element formation region and spaced apart from the zener diode; wherein the resistor includes:

a resistor doping structure being formed on the cover insulation layer and covered by the dielectric layer; wherein the resistor doping structure is a P-type doped semiconductor or an N-type doped semiconductor; and a resistor metal structure being formed on the dielectric layer and partially passing through the dielectric layer to be electrically connected to the resistor doping structure; wherein the resistor is configured to generate a resistance when the composite power element is energized.

4. The composite power element according to claim 3, further comprising:

a normal diode being located in the circuit element formation region and spaced apart from the zener diode; wherein the normal diode includes:

a normal diode doping structure being formed on the cover insulation layer and covered by the dielectric layer; wherein the normal diode doping structure includes a P-type doped region and an N-type doped region which are in contact with each other; and a normal diode metal structure being formed on the dielectric layer and partially passing through the dielectric layer to be electrically connected to the P-type doped region and the N-type doped region of the normal diode doping structure; wherein the normal diode is configured to receive a forward bias voltage when the composite power element is energized;

wherein the normal diode is disposed adjacent to the metal-oxide-semiconductor field-effect transistor.

5. The composite power element according to claim 4, wherein in the normal diode, the normal diode metal structure includes two metal pins, the two metal pins are spaced apart from each other, and both of the two metal pins partially pass through the dielectric layer to be respectively and electrically connected to the N-type doped region and the P-type doped region of the normal diode doping structure; wherein when the composite power element is energized, a potential of the metal pin connected to the P-type doped region is higher than a potential of the metal pin connected to the N-type doped region, so that the forward bias voltage is generated.

6. The composite power element according to claim 5, wherein in the normal diode, the metal pin connected to the P-type doped region is configured to be electrically connected to the gate filling structure of the metal-oxide-semiconductor field-effect transistor through a wire, and the metal pin connected to the N-type doped region is configured to be electrically connected to the source metal structure of the metal-oxide-semiconductor field-effect transistor through another wire.

7. The composite power element according to claim 4, wherein a quantity of the normal diode is plural, and a plurality of normal diodes are connected in series with each other and are all disposed on the cover insulation layer.

8. The composite power element according to claim 7, wherein in any two of the normal diodes that are adjacent and connected in series with each other, the metal pin of one of the normal diodes connected to the P-type doped region is directly in contact with and electrically connected to the metal pin of another one of the normal diodes connected to the N-type doped region; wherein the normal diode doping structure of the one of the normal diodes is not directly in contact with the normal diode doping structure of the another one of the normal diodes.

9. The composite power element according to claim 7, wherein among the plurality of normal diodes connected in series with each other, the metal pin of the first normal diode connected to the P-type doped region is configured to be electrically connected to the gate filling structure of the metal-oxide-semiconductor field-effect transistor through a wire, and a metal pin of the Nth normal diode connected to the N-type doped region is configured to be electrically connected to the source metal structure of the metal-oxide-semiconductor field-effect transistor through another wire.

10. A method for manufacturing a composite power element, comprising:

providing a substrate structure including a base layer and an epitaxial layer formed on the base layer; wherein at least one trench is concavely formed on the epitaxial layer, the substrate structure defines a transistor formation region and a circuit element formation region adjacent to the transistor formation region along a length direction of the substrate structure, and the trench is located in the transistor formation region;

extendingly forming an insulation layer on the epitaxial layer and an inner wall of the trench; wherein a portion of the insulation layer located on the inner wall of the trench is defined as a trench insulation layer which surroundingly forms a groove, and a portion of the insulation layer located on the epitaxial layer is defined as a cover insulation layer;

forming a dielectric layer on the insulation layer;

forming a metal-oxide-semiconductor field-effect transistor in the transistor formation region of the substrate structure; wherein the metal-oxide-semiconductor field-effect transistor includes: a gate filling structure, a matrix doping structure, a source metal structure, and a drain metal structure; wherein the gate filling structure is formed in the groove of the trench insulation layer, the matrix doping structure is formed in the epitaxial layer and located in a surrounding area of the trench, the source metal structure is formed on the dielectric layer and partially passes through the dielectric layer to be electrically connected to the matrix doping structure, and the drain metal structure is formed on a bottom surface of the base layer; and forming a zener diode in the circuit element formation region of the substrate structure; wherein the zener diode includes: a zener diode doping structure and a zener diode metal structure; wherein the zener diode doping structure is formed on the cover insulation layer and is covered by the dielectric layer, and the zener diode doping structure includes a P-type doped region and an N-type doped region which are in contact with each other; wherein the zener diode metal structure is formed on the dielectric layer and partially passes through the dielectric layer to be electrically connected to the P-type doped region and the N-type doped region of the zener diode doping structure; wherein the zener diode is configured to receive a reverse bias voltage when the composite power element is energized.

* * * * *